United States Patent [19]

Ibe

[11] Patent Number: 5,020,907

[45] Date of Patent: Jun. 4, 1991

[54] AXIS OFFSET MEASURING DEVICE

[75] Inventor: Hiroyuki Ibe, Nyu, Japan

[73] Assignee: Shin-Etsu Handotai Company, Limited, Tokyo, Japan

[21] Appl. No.: 427,428

[22] Filed: Oct. 27, 1989

[30] Foreign Application Priority Data

Oct. 28, 1988 [JP] Japan .................. 63-273942

[51] Int. Cl.⁵ .................. C30B 15/00; G01D 11/27
[52] U.S. Cl. .................. 356/153; 356/399
[58] Field of Search .................. 356/138, 149, 152, 154, 356/250, 399, 400

[56] References Cited

U.S. PATENT DOCUMENTS 3,727,055  4/1973  David et al. .................. 356/152
4,480,918 11/1984  DeFazio .
4,747,454  5/1988  Perryman .

FOREIGN PATENT DOCUMENTS 0037073 10/1981  European Pat. Off. .
2349718  4/1975  Fed. Rep. of Germany .
2195465  4/1988  United Kingdom .................. 356/154

OTHER PUBLICATIONS

Patent Abstracts of Japan, vol. 12, No. 132 (C-490) [2979], 22nd Apr. 1988; & JP-A-62 252 396 (Mitsubishi Metal Corp.) 04-11-1987.
Patent Abstracts of Japan, vol. 8, No. 93 (C-220) [1530], 27th Apr. 1984; & JP-A-59 8697 (Tokyo Shibaura Denki K. K.) 17-01-1984.

Primary Examiner—Richard A. Rosenberger
Attorney, Agent, or Firm—Browdy and Neimark

[57] ABSTRACT

A device for measuring offset of the axis of a single crystal lifting wire with respect to the axis of rotation of a crucible rotary shaft in a single crystal production apparatus based upon Czochralski method. The apparatus comprises a base plate (16, 16A, 16B) mounted on a table (12) fixed to the upper end of the crucible rotary shaft (10), a weight suspended from the wire (34) and having a stylus projected downward from the lower end thereof or capable of downwardly emitting a laser beam (36C), a device mounted on the base plate and capable of optically detecting the position of said stylus or said laser beam, and a device for displaying the detected position.

6 Claims, 3 Drawing Sheets

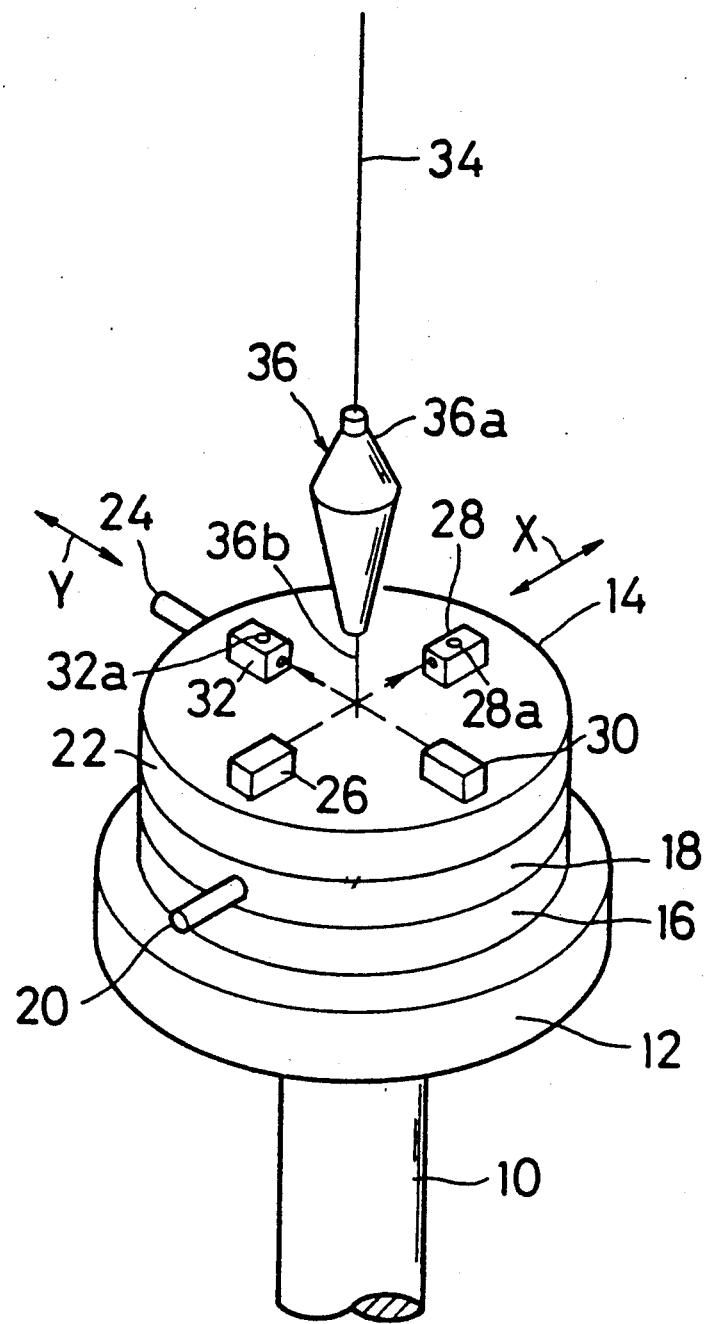
F I G. 1

AXIS OFFSET MEASURING DEVICE

BACKGROUND OF THE INVENTION

1. Field of the Invention

The present invention relates to a center axis offset measuring device which is used in a single-crystal production apparatus based upon Czochralski method and which is capable of measuring any offset of the center axis of a crystal lifting wire with respect to the axis of rotation of a crucible.

2. Description of the Related Art

In general, an apparatus for producing a single crystal based upon Czochralski method employs a wire or a shaft for lifting a grown single crystal. In order to reduce the overall height of the apparatus, a wire is preferably used rather than a shaft. The crystal lifting wire is suspended from an upper portion of the apparatus into a rotary crucible containing a molten material of the crystal. If the center axis of the crystal lifting wire is offset from the axis of rotation of the crucible, unbalance is caused in motion of the growing crystal that it cannot stationarily rotate around its axis at a special point of the molten material surface in the crucible. Thus, crystal lifting operation cannot be continued when the unbalance becomes large.

Offset of the center axis of the crystal lifting wire from the axis of rotation of the crucible inevitably occurs due to, for example, a mechanical distortion of the crystal production apparatus during a long use thereof, even though the lifting wire is initially set in axial alignment with the crucible, when a newly installed one of the apparatus is issued.

It is therefore necessary that a periodical readjustment has to be conducted so as to reduce this offset to zero during use of the single crystal production apparatus, not to mention the adjustment at the time of the initial setting.

Unfortunately, no specific consideration has been given to this problem, and the readjustment has been conducted with the help of a naked eye without conducting special measurement of the offset amount, so that an impractically long time is required for the centering of the lifting wire and the accuracy of the centering was not expected to be so high. Thus, the conventional single crystal production method tends to suffer from the above-described problem due to the offset.

This problem undesirably lowers the yield of good single crystal product. In addition, this problem becomes more serious as the diameter of the single crystal to be lifted increases. Thus, the present inventors have recognized this problem should be strictly overcome from the view point of reduction in the production cost.

SUMMARY OF THE INVENTION

Accordingly, an object of the present invention is to provide a center axis offset measuring device which is capable of easily, promptly and accurately measuring any offset of the center axis of a crystal lifting wire from the axis of a crucible.

To this end, according to the present invention, there is provided a center axis offset measuring device for use in a single crystal production apparatus based upon Czochralski method, comprising: a crucible rotary shaft; a table fixed to the upper end of the crucible rotary shaft; a base member mounted on the table such that the central axis of the crucible rotary shaft passes through a reference point on the base member; a weight suspended from a wire (34) and having a linear thin member extending from the lower end thereof, the linear thin member having an axis which coincides with the central axis of the wire when the weight is freely suspended from the wire; optical position detection means disposed on the base member and capable of detecting the position of the linear thin member with respect to the reference point within a plane perpendicular to the axis of the linear thin member; and means for displaying the detected position.

This arrangement enables the distance between the center axis of the crystal lifting wire and the axis of rotation of the crucible to be measured easily, quickly and accurately, thus making it possible to axially align the crystal lifting wire with the axis of the crucible easily, quickly and accurately. In consequence, the present invention effectively prevents an undesirable distorted form of the single crystal rod attributable to abnormal motion and therefore avoids any crystal lifting failure which may otherwise be caused by the abnormal motion.

These and other objects, features and advantages of the present invention will become clear from the following description of the preferred embodiments when the same is read in conjunction with the accompanying drawings.

BRIEF DESCRIPTION OF THE DRAWINGS

FIG. 1 is a perspective view of a first embodiment of the center axis offset measuring device in accordance with the present invention;

DESCRIPTION OF THE PREFERRED EMBODIMENTS

First Embodiment

Figure 2:
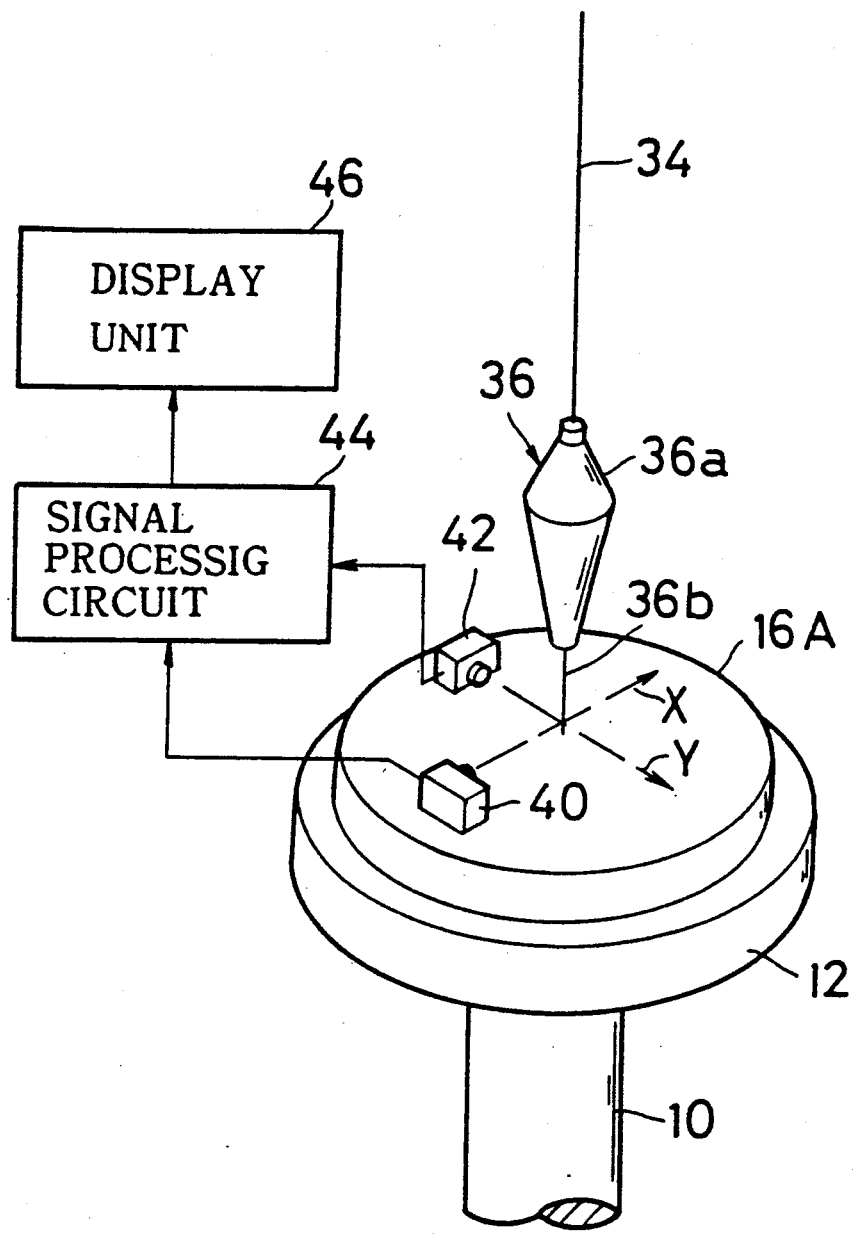
FIG. 2 is a perspective view of a second embodiment of the center axis offset measuring device in accordance with the present invention.

FIG. 1 shows a first embodiment of the center axis offset measuring device of the invention used in a single crystal production apparatus based upon Czochralski method.

An apparatus for producing a single crystal has a crucible rotary shaft 10 which has a circular table 12 at the upper end. During the crystal growing operation of the apparatus, the table 12 carries a crucible which contains a melt of the crystal material, while the crucible rotary shaft 10 rotates about its own axis and moved up and down along the axis. As shown in FIG. 1, an X-Y stage 14 can be placed on the table 12 for the purpose of centering.

The X-Y stage has a known construction. More specifically, the X-Y stage 14 has a disk-shaped base plate 16, a disk-shaped X-stage 18 secured to the base plate 16 for sliding motion in the X-direction, a micrometer head 20 connected to a feed screw (not shown) for causing a sliding movement of the X-stage 18 with respect to the base plate 16, a disk-shaped Y-stage 22 secured to the X-stage 18 for sliding movement in a Y-direction which is orthogonal to the X-direction, and a micrometer head 24 connected to a feed screw (not shown) for causing a sliding movement of the Y-stage 22 in the Y-direction with respect to the X-stage 18. The arrangement is such that a rotation of the micrometer head 20 causes the X-stage 18 to slide in the X-direction with respect to the base plate 16. Similarly, a rotation of the micrometer head 24 causes the Y-stage 22 to slide in the Y-direction with respect to the X-stage 18. The micrometer heads 20 and 24 are provided with scales which indicate, respectively, the amount of movement of the X-stage 18 in the X-direction with respect to the base pate 16 and the amount of movement of the Y-stage in the Y-direction with respect to the X-stage 18, as measured from an original position where the centers of the base plate 16, X-stage 18 and the Y-stage 22 are aligned with one another. The base plate 16 is provided with a locating projection or recess (not shown) formed on or in the lower surface thereof, while the table 12 is provided with a mating recess or projection (not shown) formed in or on the upper surface thereof. The arrangement is such that the axis of the base plate 16 is automatically aligned with the axis of rotation of the crucible rotary shaft 10 when these mating projection and recess fit each other.

A light-emitting device 26 and a light-receiving device 28 are fixedly mounted on the Y-stage 22 such that they oppose each other across the center of the Y-stage 22 and such that the common optical axis of these devices 26 and 28 extend in parallel with the X-direction. Similarly, a light-emitting device 30 and a light-receiving device 32 are fixedly mounted on the upper surface of the Y-stage 22 such that they oppose each other across the center of the Y-stage 22 and such that the common optical axis of these devices 30 and 32 extend in parallel with the Y-direction.

The light-receiving devices 28 and 32 are respectively provided with detection indicator lamps 28a and 32a which are composed of light-emitting diodes. These lamps turn on when the lights from the associated light-emitting devices 26 and 30 are interrupted.

The single crystal production apparatus has a crystal lifting wire 34 suspended from an upper portion of the apparatus down to a region above the X-Y stage 14. A weight 36 is connected to the lower end of the crystal lifting wire 34. The weight 36 has a rotational symmetrical form with its axis coinciding with the center axis of the crystal lifting wire 34. The weight 36 includes a weight body 36a which at the center of the upper end thereof is connected to the crystal lifting wire 34, and a stylus 36a projected from the center of the lower end surface of the weight body 36a.

The operation of the first embodiment is as follows.

As shown in FIG. 1, the base plate 16 is placed on the table 12 and the micrometer heads 20 and 24 are rotated to indicate zero on their scales, so that the crucible rotary shaft 10, base pate 16, X-stage 18 and the Y-stage 22 are axially aligned. Subsequently, a take-up drum (not shown) is rotated to extend and lower the crystal lifting wire 34. The lowering of the crystal lifting wire 34 is stopped when the lower end of the stylus 36b has reached a level which is slightly higher than the upper surface of the table 12. Subsequently, the micrometer head 20 is rotated to move the X-stage 18 in the X-direction with respect to the base plate 16. The rotation of the micrometer head 20 is stopped when the detection indicator lamp 32a is lit on. Then, the micrometer head 24 is rotated to move the Y-stage 22 in the Y-direction with respect to the X-stage 18. The rotation of the micrometer head 24 is stopped when the detection indicator lamp 28 is lit on. Values X and Y indicated on the scales of the respective micrometer heads 20 and 24 are read in this state. The coordinate values (X,Y) represent the offset coordinate position of the center of the crystal lifting wire 34 with respect to the axis of the crucible rotary shaft 10. Subsequently, the position of the take-up drum or the position of a base (not shown) supporting the crucible rotary shaft 10 is moved to negate the offset, i.e., to change the coordinate values (X, y) to (0, 0).

This centering operation is conducted when the crystal production apparatus is initially assembled and installed. In addition, readjusting centering operation is conducted periodically during long use of the crystal production apparatus.

Second Embodiment

The offset measurement with the first embodiment described requires a manual operation of the micrometer heads 20 and 24. In a second embodiment of the offset measuring device of the invention, the necessity for the manual operation is eliminated as will be understood from the following description taken in conjunction with FIG. 2.

Referring to FIG. 2, the table 12 carries a base plate 16A which in turn carries linear cameras 40 and 42 which are fixed thereto such that their optical axes pass the center of the base plate 16A and orthogonally intersect each other. The linear camera 40 detects the position of a stylus 36b in the Y-direction, while the linear camera 42 detects the position of the stylus 36b in the X-direction. Video signals output from the linear cameras 40 and 42 are supplied to a signal processing circuit 44 which processes these signals to determine the coordinate values (X, Y) of offset of the stylus 36b with respect to the axis of the crucible rotary shaft 10. The result of detection of the offset is displayed on a display device 46. Locating projection and recess are formed on or in the lower surface of the base plate 16 and the upper surface of the table 12 as in the case of the first embodiment.

After the detection of the offset position, the centering of the crystal lifting wire with respect to the axis of the crucible rotary shaft is executed in the same manner as the first embodiment.

Third Embodiment

In the embodiments described hereinbefore, it is necessary to lower the crystal lifting wire 34 and to stop the lowering of the wire 34 when the stylus 36b of the weight 36 has reached a level slightly above the surface of the Y-stage 22 or the base plate 16A. A third embodiment of the invention, which will be described hereinafter with reference to FIG. 3, eliminates the necessity for the operation for lowering the crystal lifting wire for the purpose of measurement of the offset.

Figure 3:
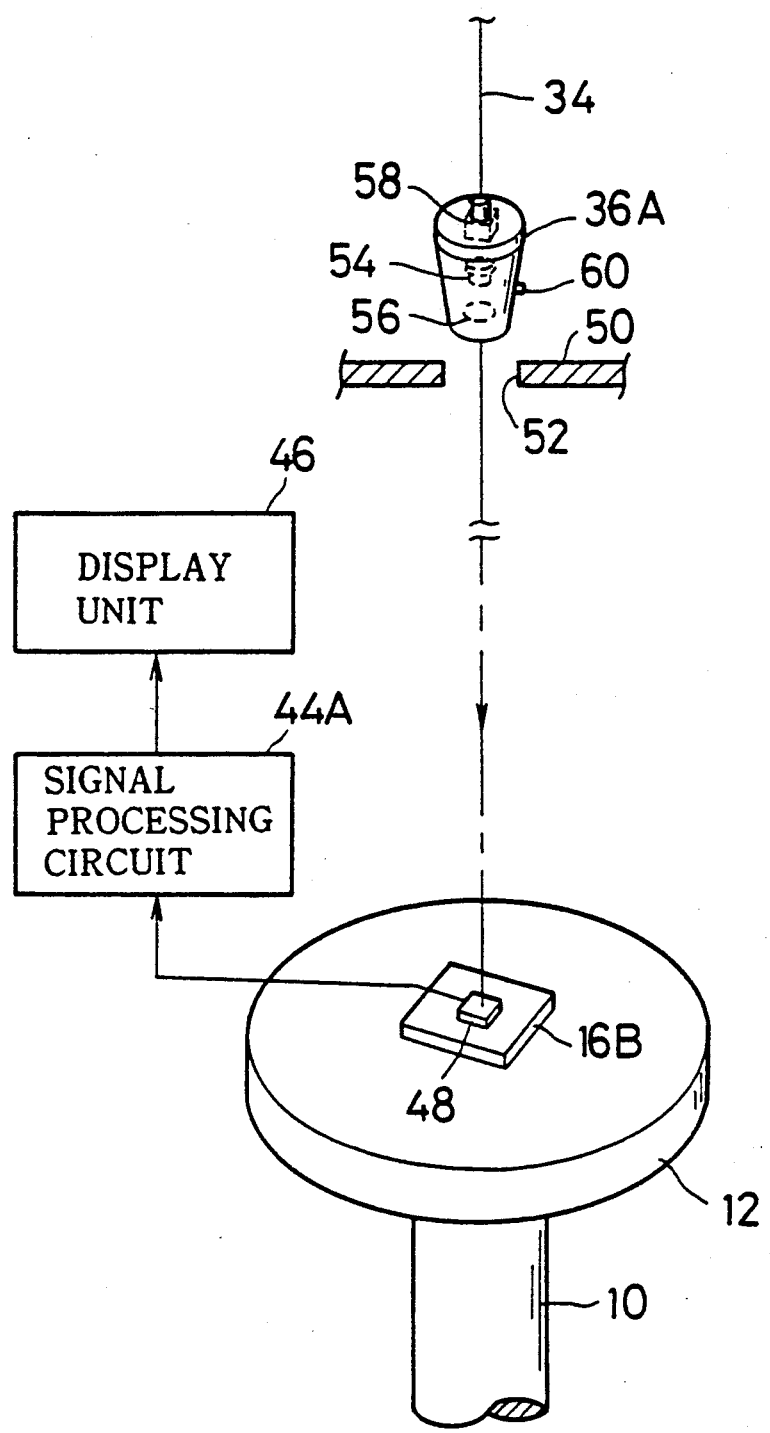
FIG. 3 is a perspective view of a third embodiment of the center axis offset measuring device in accordance with the present invention.

Referring to FIG. 3, the table 12 carries at its upper surface a base plate 16B which in turn carries a two-dimensional image sensor 48 fixed to the center thereof with its light-receiving surface directed upward. The two-dimensional image sensor 48 mounted on the base plate 16B can be located with respect to the axis of the crucible rotary shaft 10 such that the axis of the crucible rotary shaft 10 passes through the center of the two-dimensional image sensor 48, merely by bringing a locating projection or recess on or in the lower surface of the base plate 16B into engagement with a locating recess or projection formed in or on the upper surface of the table 12.

A chamber upper plate 50 provided above the table 12 has a central circular hole 52. A weight 36A connected to the lower end of the crystal lifting wire 34 is positioned right above the circular hole 52. The weight 36 has a rotationally symmetrical form and is disposed such that the center axis thereof is aligned with the center axis of the suspended crystal lifting wire 34. The weight 36A has a container which receives a laser diode 54, a collimate lens 56 and a battery 58 as a power supply for the laser diode, and a switch 60 provided on the surface of the container and arranged for manipulation to turn the laser diode 54 on and off. The common optical axis of the laser diode 54 and the collimate lens 56 coincide with the central axis of the weight 36A so that the laser beam 36C from the laser diode 54 is collimated by the collimate lens 56 so as to impinge upon the two-dimensional image sensor 48 through the imaginary center line of the crystal lifting wire 34.

Pixel signals picked up from the two-dimensional image sensor 48 are processed by the signal processing circuit 44A as in the case of the second embodiment so that the position of the light spot on the two-dimensional image sensor 48 is determined in terms of the coordinate values (X, Y) and is displayed on a display device 46.

Obviously, the two-dimensional image sensor 48 may be substituted by a two-dimensional camera having an image-forming lens disposed at a level above the level of the two-dimensional image sensor 48.

Although the invention has been described through its specific form, it is to be understood that the described embodiments are only illustrative and various changes and modifications maybe imparted thereto without departing from the scope of the invention which is limited solely by the appended claims.

What is claimed is:

1. A center axis offset measuring device for use in a single crystal production apparatus based upon Czochralski method, comprising:
   a crucible rotary shaft (10);
   a table (12) fixed to the upper end of said crucible rotary shaft (10);
   a base member (16, 16A, 16B) mounted on said table (12) such that the central axis of said crucible rotary shaft passes through a reference point on said base member (16, 16A, 16B);
   a weight suspended from a wire (34) and having a linear thin member (36b, 36c) emerging from the lower end thereof, said linear thin member having an axis which coincides with the central axis of said wire when said weight is freely suspended from said wire (34);
   optical position detection means disposed on said base member (16, 16A, 16B) and capable of detecting the position of said linear thin member with respect to said reference point within a plane perpendicular to the axis of said linear thin member; and
   means for displaying the detected position.

2. A device according to claim 1, wherein said base member is a fixed member (16) of an X-Y stage;
said linear thin member includes a stylus (36b); and
said optical position detection means includes:
   movable portions of said X-Y stage having coordinate reading portions;
   a pair of light sources (26, 30) mounted on said X-Y stage such that the lights emitted therefrom run in parallel with the X- and Y-axes of said X-Y stage;
   photo-detectors (28, 32) arranged on said X-Y stage so as to be able to receive the lights emitted from said light sources and capable of detecting whether the lights from said light sources are interrupted by said stylus; and
   means for informing an operator of the contents of the outputs of said photo-detectors.

3. A device according to claim 1, wherein said linear thin member includes a stylus (36b); and wherein said optical position detection means includes a pair of electronic cameras (40, 42) having image sensors and arranged such that the projections of the optical axes of said cameras (40,42) on said base member (16A) orthogonally intersect each other and such that the point of intersection of said projections pass through said reference point, said optical position detection means further including means (44) for processing image signals from said electronic cameras so as to determine the position of said stylus with respect to said reference point within a plane perpendicular to the axis of said stylus.

4. A device according to claim 3, wherein said image sensors are liner image sensors.

5. A center axis offset measuring device for use in a single crystal production apparatus based upon Czochralski method, comprising:
   a crucible rotary shaft (10);
   a table (12) fixed to the upper end of said crucible rotary shaft (10);
   a base member (16, 16A, 16B) mounted on said table (12) such that the central axis of said crucible rotary shaft passes through a reference point on said base member (16, 16A, 16B);
   a weight suspended from a wire (34) and having a semiconductor laser (54) and a collimator (56) capable of collimating a laser beam emitted from said semiconductor laser so that said weight emits a laser beam (36C) emerging downwardly;
   optical position detection means disposed on said base member (16B) and having a two-dimensional image sensor (48) with a light-receiving surface of said sensor directed upwardly so as to detect the position of said laser beam with respect to said reference point;
   means (44A) for processing image signals from said two-dimensional image sensor so as to detect the position of said light spot; and
   means for displaying the detected position.

6. A device according to claim 5, wherein said two-dimensional image sensor is provided in an electronic camera.

* * * * *